United States Patent
Krueger et al.

(10) Patent No.: US 6,897,114 B2
(45) Date of Patent: May 24, 2005

(54) METHODS OF FORMING A TRANSISTOR HAVING A RECESSED GATE ELECTRODE STRUCTURE

(75) Inventors: Christian Krueger, Liegau-Augustusbad (DE); Thomas Feudel, Radebeul (DE); Volker Grimm, Langebrueck (DE)

(73) Assignee: Advanced Micro Devices, Inc., Austin, TX (US)

( * ) Notice: Subject to any disclaimer, the term of this patent is extended or adjusted under 35 U.S.C. 154(b) by 0 days.

(21) Appl. No.: 10/609,719

(22) Filed: Jun. 30, 2003

(65) Prior Publication Data

US 2004/0126965 A1 Jul. 1, 2004

(30) Foreign Application Priority Data

Dec. 27, 2002 (DE) ........................... 102 61 145

(51) Int. Cl.⁷ ............................................. H01L 21/336
(52) U.S. Cl. ........................................ 438/259; 438/270
(58) Field of Search ................................. 438/259, 270, 438/271, 272, 289, 291, 294, 296, 589

(56) References Cited

U.S. PATENT DOCUMENTS 6,319,776 B1 * 11/2001 Tung ........................... 438/270
6,358,800 B1 * 3/2002 Tseng ......................... 438/268
6,642,130 B2 * 11/2003 Park ........................... 438/589

* cited by examiner

Primary Examiner—Hoai Pham
(74) Attorney, Agent, or Firm—Williams, Morgan & Amerson, P.C.

(57) ABSTRACT

In manufacturing a recessed gate transistor, a channel implantation and a source/drain implantation are performed by means of a single implantation mask prior to the formation of a gate opening. Thereafter, the gate opening is formed to a depth that extends substantially to the channel implant so that raised drain and source regions are created which are substantially even with the gate electrode formed in the gate opening. Consequently, expensive and complex epitaxial growth steps can be avoided.

66 Claims, 3 Drawing Sheets

METHODS OF FORMING A TRANSISTOR HAVING A RECESSED GATE ELECTRODE STRUCTURE

BACKGROUND OF THE INVENTION

1. Field of the Invention

Generally, the present invention relates to the fabrication of integrated circuits, and, more particularly, to field effect transistors having a reduced drain and source sheet resistance by recessing the gate electrode structure with respect to the drain and source regions.

2. Description of the Related Art

In fabricating integrated circuits having improved performance in view of operational speed and power consumption, the fabrication of field effect transistors, such as MOS transistors, is a key technology. A high operating speed in combination with an increased package density of integrated circuits requires the formation of field effect transistors having an extremely short channel length, i.e., the distance between highly doped source and drain regions forming a PN junction with an inversely doped channel region disposed therebetween. The shrinkage of the transistor dimensions, however, entails a plurality of issues associated therewith which have to be solved so as to not unduly offset the advantages obtained by minimizing the features sizes.

One problem in this respect is the requirement of extremely shallow PN junctions, that is, the depth of the source and drain regions with respect to an interface formed by a gate insulation layer and the channel region has to be decreased as the channel length is reduced. The depth of the source and drain regions, however, significantly determines the sheet resistance of these regions, and the sheet resistance may not arbitrarily be reduced by correspondingly doping the source and drain regions, since the dopants implanted into the source and drain regions at very high concentrations may not be completely activated by conventional rapid thermal anneal cycles without negatively affecting the overall dopant profile within the source and drain regions. With decreasing dimensions of the field effect transistors, the acceptable amount of diffusion of implanted dopants, also referred to as thermal budget, is also to be restricted, thereby imposing quite severe constraints on the involved anneal cycles.

Extremely shallow source and drain regions may be formed by raising the source and drain regions above the gate insulation layer/channel region interface so that the resulting sheet resistance of the enlarged source and drain regions is decreased while maintaining a required low depth of the PN junctions. Raising the source and drain regions adjacent to the gate electrode may be achieved by epitaxial growth of silicon, which, however, gives rise to a large number of problems. The epitaxial growth of the source and drain regions may produce facets or voids at interfaces with spacer elements formed adjacent to the gate electrode and silicide spikes may be formed during silicidation of the drain/source regions and the gate electrode. Additionally, during the epitaxial growth of the raised source and drain regions, dopants of extension regions formed below the spacer elements of the gate electrode may readily diffuse, thus significantly affecting the final dopant profile and also influencing the dopant concentration in the channel region. Therefore, additional adjustments of the dopant profile in the channel region are typically required. Furthermore, the epitaxial growth of the raised source and drain regions may lead to a reduced process yield due to the issues involved in precisely controlling the thickness of the epitaxial layer. In addition to the above-described disadvantages, the epitaxial growth of the raised source and drain regions significantly contributes to process complexity and tool costs.

In view of the above-identified issues in fabricating source and drain regions of reduced sheet resistance, a need exists for an improved technique that substantially avoids or at least reduces one or more of the above-identified problems.

SUMMARY OF THE INVENTION

Generally, the present invention is directed to a technique for forming a field effect transistor having a recessed gate structure, wherein epitaxial growth steps may be avoided in that the gate structure is formed in an opening of a semiconductor region having received a channel and a source drain region implant prior to the formation of the gate structure.

According to one illustrative embodiment of the present invention, a method of forming a recessed gate transistor comprises forming a resist mask over a substrate, wherein the resist mask exposes an active region formed in the substrate. A first dopant species is implanted into the active region to a first depth and a second dopant species is implanted into the active region to a second depth that is less than the first depth. Additionally, a gate opening is formed in the active region, wherein a depth of the gate opening substantially corresponds to the first depth.

According to a further illustrative embodiment of the present invention, a method of forming a recessed gate transistor comprises forming a gate opening in an active region formed in a substrate, wherein the active region has a first dopant species provided at a first depth and a second dopant species provided at a second depth that is less than the first depth, whereby a depth of the gate opening extends substantially to the first depth. A gate electrode structure is formed in the gate opening and then the substrate is annealed to form source/drain regions and extension regions by diffusing the first dopant species.

According to still a further illustrative embodiment of the present invention, a method of forming shallow source/drain extension regions in a recessed gate transistor comprises implanting a first dopant species with a first implantation energy into an active region formed in a substrate. A second dopant species is implanted into the active region with a second implantation energy and a recessed gate electrode structure is formed in the active region. Finally, source/drain extension regions adjacent to the gate electrode structure are formed by annealing the substrate.

In accordance with still a further illustrative embodiment of the present invention, a recessed gate transistor comprises a gate electrode structure having an upper surface portion and drain/source regions having an upper surface portion. The upper surface portion of the gate electrode is substantially even with the upper surface portions of the source/drain regions.

BRIEF DESCRIPTION OF THE DRAWINGS

The invention may be understood by reference to the following description taken in conjunction with the accompanying drawings, in which like reference numerals identify like elements, and in which.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present invention will now be described with reference to the attached figures. Although the various regions and structures of a semiconductor device are depicted in the drawings as having very precise, sharp configurations and profiles, those skilled in the art recognize that, in reality, these regions and structures are not as precise as indicated in the drawings. Additionally, the relative sizes of the various features and doped regions depicted in the drawings may be exaggerated or reduced as compared to the size of those features or regions on fabricated devices. Nevertheless, the attached drawings are included to describe and explain illustrative examples of the present invention. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

In the following illustrative embodiments of the present invention it is referred to field effect transistors formed in a silicon-based substrate, such as a bulk silicon substrate or a silicon-on-insulator (SOI) substrate, since silicon-based integrated circuits represent the most frequently used semiconductor devices. It should be emphasized, however, that the principles of the present invention may be readily applied to any type of field effect transistor formed in any appropriate substrate including suitable semiconductive materials. For example, field effect transistors in accordance with the present invention may be formed in any II–VI semiconductors, III–V semiconductors and may especially be suited for the formation of gallium arsenide-based transistor elements, as these devices are preferably employed in high frequency applications.

Figure 1A:
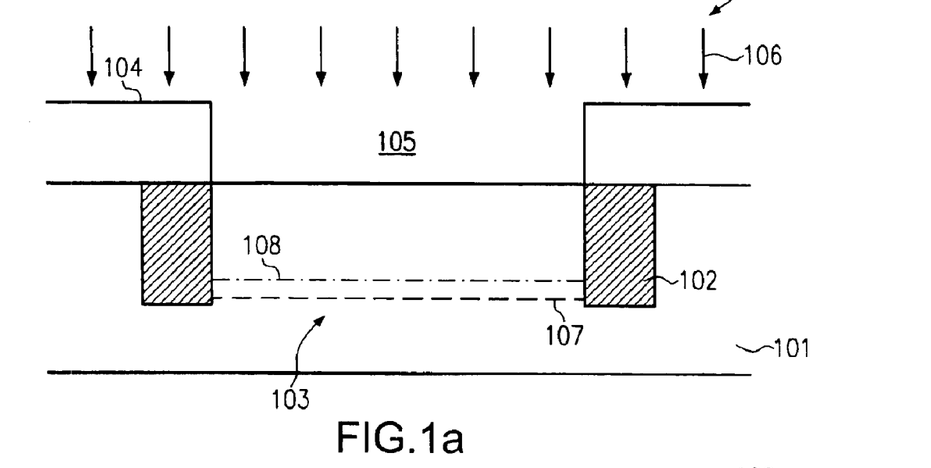
FIGS. 1a–1i schematically show cross-sectional views of a field effect transistor having a recessed gate electrode structure during various manufacturing stages in accordance with illustrative embodiments of the present invention.

With reference to FIGS. 1a–1i, further illustrative embodiments of the present invention will now be described in more detail. In FIG. 1a, a semiconductor structure 100 comprises a substrate 101, which, as noted above, may represent any appropriate substrate and in the present example may be represented by a silicon substrate. An active region 103 is defined within the substrate 101 by an isolation structure 102, which is configured in the embodiment illustrated in FIG. 1a by a shallow trench isolation, wherein in other embodiments any other isolation structure, such as a LOCOS structure, may be used. A resist mask 104 is formed above the substrate 101 and includes an opening 105 that essentially exposes the active region 103. The semiconductor structure 100 is subjected to an ion bombardment 106.

A typical process flow for forming the semiconductor structure 100 as shown in FIG. 1a may comprise the following processes. The trench isolations 102 may be formed by well-known trench isolation processes, such as photolithographically forming a resist layer and anisotropically etching trenches into the substrate 101, subsequently filling the substrate with a dielectric material, such as silicon dioxide, and removing excess material by chemical mechanical polishing of the substrate 101. Thereafter, a resist layer (not shown) is formed on the substrate 101 with a thickness that is appropriate to substantially completely stop ions during the ion bombardment 106. Typically, a thickness of the resist layer may be in the range of approximately 1–2 $\mu$m. Next, the resist layer is patterned by standard photolithography techniques to form the opening 105, exposing the active region 103. Thereafter, an ion implantation sequence is carried out so as to generate the ion bombardment 106. The implantation sequence comprises the implantation of at least one first dopant species of an appropriate type so as to generate a desired vertical dopant concentration within the active region 103 down to a desired first depth. In FIG. 1a, the concentration profile of the first dopant species with the first depth is indicated by a single dashed line 107, wherein the actual dopant concentration may be distributed vertically over a certain distance determined by the implantation specifics, such as substrate material, type of dopant, crystallinity of the substrate material, implant energy, and the like. The profile 107 may substantially extend to the first depth. The profile 107 is representative of a channel implant profile and may be designed in any adequate manner required for a transistor to be formed. Depending on the type of transistor to be formed in the active region 103, P-type dopants or N-type dopants may be implanted into the active region 103. In one embodiment, boron ions may be implanted to form the first dopant profile 107, wherein an ion energy of approximately 300–400 keV is used to locate the first dopant profile 107 at a depth of approximately 200–300 nm. The implantation dose may be selected to be approximately $10^{12}$–$10^{13}$ ions/cm$^2$. For arsenic ions as N-type dopant species, an implantation energy in the range of approximately 780–820 keV at a dose of approximately $10^{12}$–$10^{13}$ ions/cm$^2$ may be used to create the first dopant profile 107.

The implantation sequence may then be continued with the implantation of a second dopant species to form a second dopant profile 108 down to a second depth, wherein the second dopant species is of an inverse conductivity type than the first dopant species so as to create drain/source regions with corresponding PN junctions. For a P-channel transistor element, for example, boron ions may be implanted to obtain the second dopant profile 108 with an implantation energy in the range of approximately 5–10 keV at a dose of approximately $10^{15}$–$10^{16}$ ions/cm$^2$, and for an N-channel transistor, arsenic ions may be implanted with an implantation energy in the range of approximately 5–15 keV at a dose of approximately $10^{15}$–$10^{16}$ ions/cm$^2$.

It should be noted that, contrary to conventional devices, the second dopant species, i.e., the source/drain dopants, are introduced to a depth of approximately 200–300 nm and, therefore, extremely low energies, as in the conventional process in forming ultra shallow PN junctions, are not required. Therefore, any issues associated with the implantation of low energy ions into a substrate in view of concentration profile and the like may be substantially avoided. Moreover, it should be appreciated that the ion bombardment 106, including the implantation of the first dopant species with the first dopant profile 107 and the second dopant species with the second dopant profile 108, may be carried out with the same resist mask 104, thereby reducing the number of photolithography patterning steps compared to the formation of conventional transistor devices.

Figure 1B:
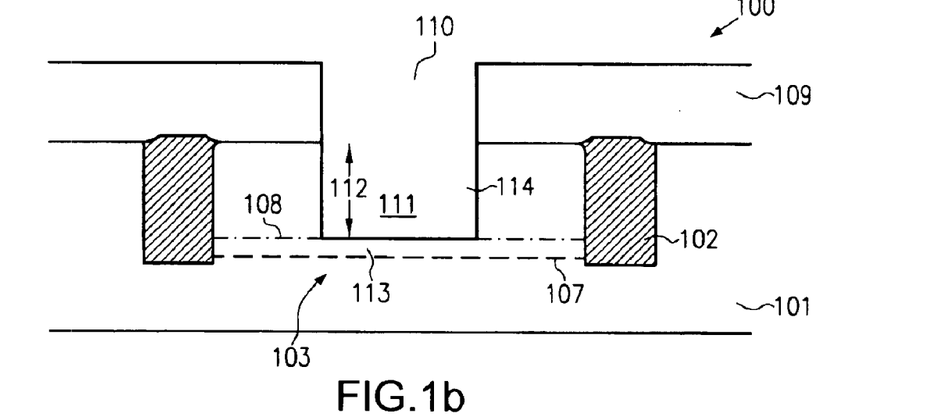

FIG. 1b schematically shows the semiconductor structure 100 in a further advanced manufacturing stage. A resist mask 109 is formed over the substrate 101 with an opening 110 formed in the resist mask 109. A gate opening 111 is formed in the active region and has a depth 112 that substantially corresponds to the vertical extension of the second dopant profile 108. That is, at a channel region 113 below the gate opening 111, the dopant concentration is substantially determined by the first dopant profile 107, wherein, due to the nature of the implantation process, a certain "overlap" between the first dopant profile 107 and the second dopant profile 108 may exist. By denoting the depth 112 of the gate opening 111 as "corresponding" to the second dopant profile 108, it is therefore meant that the gate opening 111 extends down into the active region 103 to a depth in which the dopant concentration of the channel region 113 is appropriate to provide for a conductivity that meets the requirements for the transistor element under consideration. That is, the electrical characteristics of the channel region 113 are essentially determined by the first profile 107 substantially without being affected by the second profile 108.

A typical process flow for forming the semiconductor structure 100 as shown in FIG. 1b may comprise the following steps. After removal of the resist mask 104 (see FIG. 1a), the resist mask 109 is formed by standard photolithography techniques. Thereafter, an anisotropic etch process is performed with well-established process parameters to form the gate opening 111 in the active region 103. Since etching the semiconductive material in the active region 103 is generally a well-understood process, especially when the active region 103 is comprised of silicon, the depth 112 of the gate opening 111 may be adjusted by correspondingly controlling one or more of the process parameters of the anisotropic etch process. For example, the etch time may be controlled for a given setting of the remaining process parameters. Moreover, vertical dopant profiles, such as the first and second dopant profiles 107, 108 may be precisely determined by standard metrology systems readily available in semiconductor facilities, so that in one embodiment the first and/or second dopant profiles 107, 108, i.e., especially their vertical extensions, are measured prior to the anisotropic etch process for forming the gate opening 111. The process parameters for the etch process may then be selected in correspondence with the measurement results for the first and second profiles 107, 108. Thus, the depth 112 may be adapted to the first and second dopant profiles 107, 108 with a required accuracy so as to obtain an appropriate dopant concentration in the channel region 113. Moreover, a width of the gate opening 111 may be adjusted according to the desired gate length and desired parasitic Miller capacitance, as will be explained in more detail below.

Figure 1C:
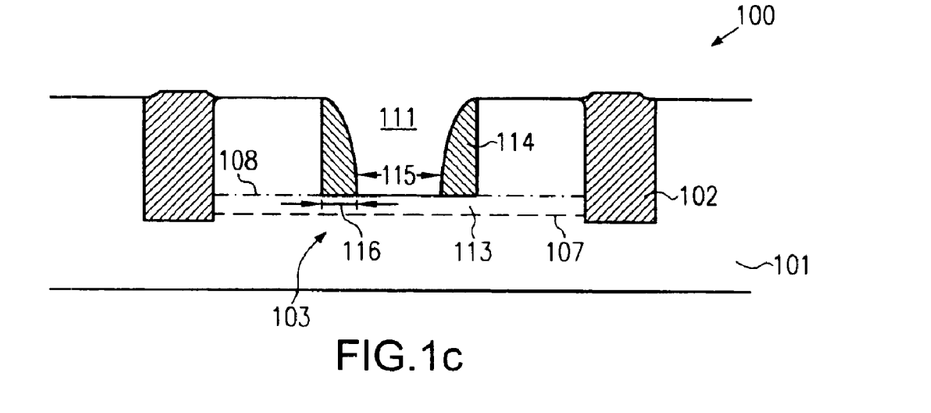

FIG. 1c schematically shows the semiconductor structure 100 with dielectric spacer elements 114 formed on sidewalls of the gate opening 111. The spacer elements 114 have a width at the bottom of the gate opening 111, which is indicated by reference number 116 and which will be referred to as the spacer width, although a thickness thereof may decrease in the upward direction, as is shown in FIG. 1c. The width 116 of the spacers 114 determines, in combination with the lateral extension of the gate opening 111, a final gate length, indicated by 115, of the transistor to be formed.

The process flow for forming the structure 100 as shown in FIG. 1c may be as follows. After the removal of the resist mask 109, a layer stack of dielectric material (not shown) may be deposited, wherein the dielectric layer stack may comprise a first etch stop layer (not shown) and formed thereon a second dielectric layer. For instance, the etch stop layer may be comprised of silicon nitride and the dielectric layer may be comprised of silicon dioxide. The etch stop layer and the dielectric layer may be deposited by well-established and well-controllable deposition techniques, such as chemical vapor deposition (CVD), to form the dielectric layer stack in a substantially conformal manner over the substrate 101 and within the gate opening 111. Since the gate length 115 is substantially determined by the spacer width 116 for a given width of the gate opening, the thickness of the dielectric layer and of the etch stop layer, especially at the sidewalls of the gate opening 111, may be controlled in such a manner that a finally desired gate length 115 is obtained. Since the conformal deposition of dielectric layers by chemical vapor deposition is a well-established technique, it should be appreciated that appropriate deposition parameters may be selected in conformity with design requirements, tool availability, and the like. Thereafter, an anisotropic etch process is performed to remove excess material of the dielectric layer, wherein the provision of the etch stop layer allows to fine tuning of the gate length 115, for example, by controlling the process time of the anisotropic etch process. For instance, slight variations in the preceding deposition process, for example, detected by layer thickness measurements, may be compensated for by correspondingly adjusting the etch time so as to modify the spacer width 116 in accordance with the detected thickness variation. Next, in a separate etch process, the etch stop layer may be removed, thereby exposing the channel region 113.

Figure 1D:
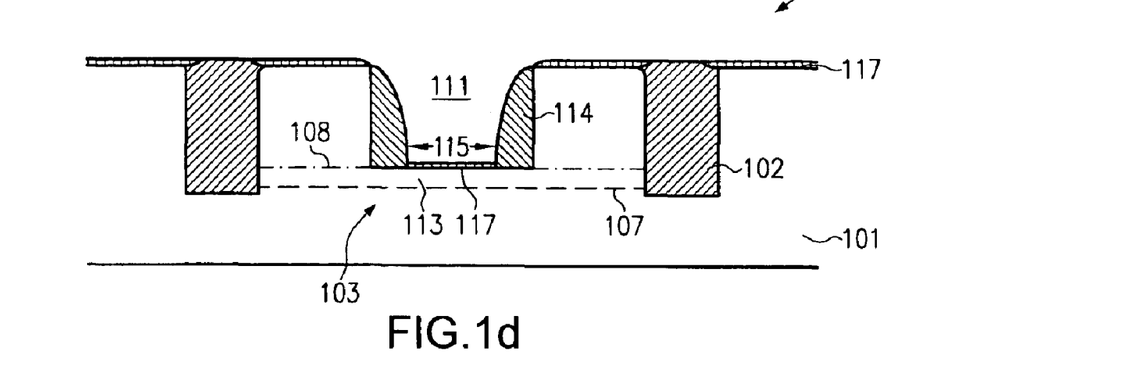

FIG. 1d schematically shows the semiconductor structure 100 with a gate insulation layer 117 formed on the bottom of the gate opening 111. In one embodiment, the gate insulation layer 117 is substantially comprised of an oxide of the semiconductive material of the channel region 113, for instance, a silicon dioxide for a silicon-based semiconductor structure 100, wherein a thickness of the gate insulation layer 117 is controlled in accordance with design requirements and especially in conformity with the gate length 115. Typically, in silicon-based transistor devices having a gate length in the range of 0.1 $\mu$m and less, the thickness of the gate insulation layer, when formed of silicon dioxide, is in the range of approximately 2–4 nm. In other embodiments, the gate insulation layer 117 may be comprised of a dielectric material having a significantly higher k value than silicon dioxide, so that the physical thickness of the gate insulation layer 117 may correspondingly be increased, thereby reducing static leakage currents. For instance, the gate insulation layer 117 may include a relatively thin silicon dioxide layer, having a thickness of 1 nm or even less, followed by a nitrogen-rich silicon oxide layer, which exhibits a higher permittivity than a pure silicon dioxide layer. In other embodiments, the gate insulation layer 117 may further include so-called high-k dielectric materials to further increase the physical thickness of the gate insulation layer 117 while yet maintaining a strong capacitive coupling of a gate electrode still to be formed to the underlying channel region 113.

The gate insulation layer 117, when comprised of silicon dioxide, may be formed by a standard furnace oxidation or by a rapid thermal oxidation. In other embodiments, a thermal oxide may be grown and subsequently a nitridation may be performed to incorporate nitrogen into the gate insulation layer 117. In other embodiments, the gate insulation layer 117 may be formed by advanced deposition methods, wherein, in some applications, a thin thermal oxide may be grown prior to the deposition process in order to improve corner rounding of the gate insulation layer 117 compared to a case in which the gate insulation layer 117 is formed exclusively by deposition. The thickness of the gate insulation layer 117, when formed by deposition, especially when high-k dielectric materials with a relatively high physical thickness are used, may increase the thickness of the space width 116, and this effect may be taken into consideration by accordingly controlling the thickness of the spacers 114 during the formation sequence described with reference to FIG. 1d. For instance, if the gate insulation layer 117 is deposited with a physical thickness of approximately 5 nm, the spacers 114 may be formed such that the actual spacer width 116 (see FIG. 1c) is 5 nm less than required for the desired design gate length 115, which is then obtained after the deposition of the gate insulation layer 117.

Figure 1E:
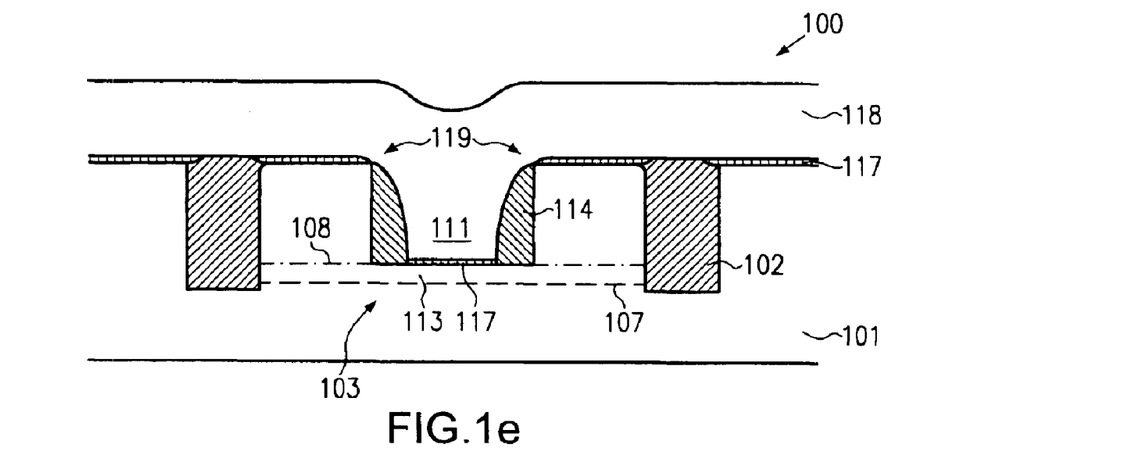

FIG. 1e schematically shows the semiconductor structure 100 with a layer of gate electrode material 118 formed over the substrate 101 and within the gate opening 111. The layer 118 may be comprised of any appropriate material for forming a gate electrode within the gate opening 111, and, in one particular embodiment, the layer 118 is substantially comprised of polysilicon. The layer 118 is provided with a thickness that allows reliable filling of the gate opening 111. The layer 118 may be formed by well-known and well-established deposition methods, such as plasma enhanced CVD, and the like. Thereafter, the excess material of the layer 118 is removed by chemical mechanical polishing (CMP). The CMP process is designed such that the gate electrode material of the layer 118 is reliably removed from surface portions to avoid shorts and leakage currents between adjacent conductive regions, such as the material within the gate opening 111 and the areas of the active region 103 adjacent to the spacer elements 114. Moreover, the CMP process may be controlled such that upper portions 119 of the spacer elements 114, which may exhibit a relatively low width, are significantly "over-polished" so as to reduce the risk of breakthrough and/or leakage current between the gate electrode material in the gate opening 111 and the portions of the active region 103 adjacent to the spacer elements 114.

Figure 1F:
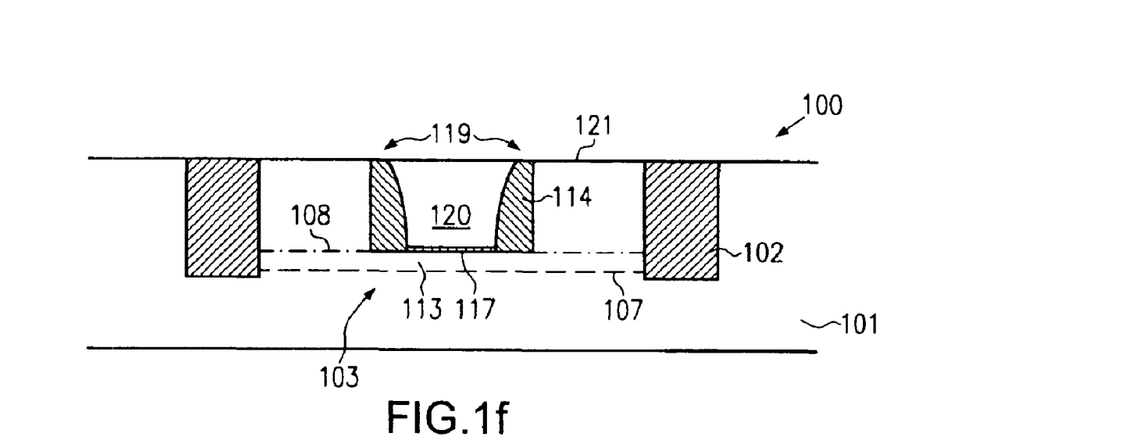

FIG. 1f schematically shows the semiconductor structure 100 after completion of the above-described CMP process, wherein the excess material of the layer 118 is removed and a "thickness" of the structure 100 is reduced by the aforementioned "over-polish." Consequently, a gate electrode 120 is formed having a surface that is substantially even with the upper portions 119 of the spacer elements 114 and is also substantially even with a surface 121 of the active region 103 and the trench isolations 102. It should be appreciated that the term "substantially even with" is to be understood to include fluctuations of the surface 121 induced by process non-uniformities of the CMP process. Non-uniformities on the surface 121 may be caused by different removal rates of the materials of the active regions 103, the gate electrode 120, the spacers 114 and the trench isolations 102, thereby possibly creating minute height differences of the various regions.

Due to the "over-polish" during the preceding CMP process, the upper portions 119 of the spacer elements 114 reliably electrically insulate the gate electrode 120 from the portions of the active region 103 adjacent to the spacer elements 114 and including the second dopant species with the second profile 108.

Figure 1G:
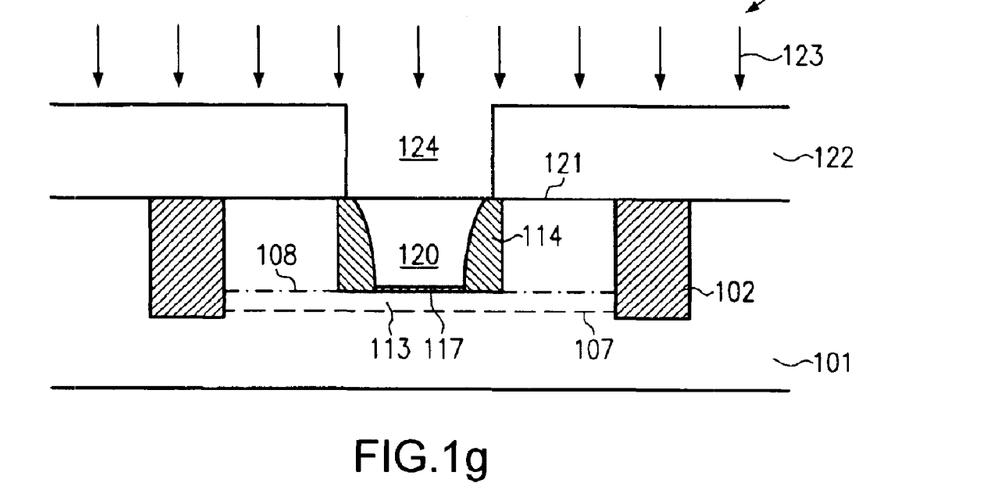

FIG. 1g schematically shows the semiconductor structure 100 in a further advanced manufacturing stage. A resist mask 122 is formed over the structure 100 and includes an opening 124 so as to substantially expose the gate electrode 120. The resist mask 122 may be formed in accordance with well-established photolithography techniques wherein a thickness thereof is selected so as to substantially block ions during an ion implantation 123 with a dopant species used to enhance the conductivity of the gate electrode 120. During the ion implantation 123, the implantation energy is selected so as to substantially avoid or at least minimize penetration of ions into the gate insulation layer 117 and into the channel region 113. Moreover, the type of dopant species, as well as the desired concentration thereof, in the gate electrode 120 may be selected so as to obtain an optimum dopant distribution within the gate electrode 120.

Figure 1H:
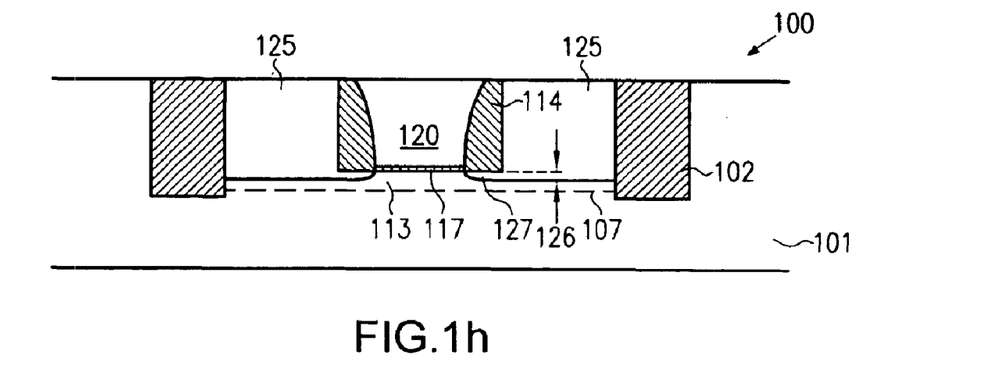

FIG. 1h schematically shows the semiconductor structure 100 with the resist mask 123 removed and with source and drain regions 125 formed adjacent to the spacer elements 114 and with extension regions 126 laterally extending into the channel region 113 beyond the spacer elements 114. The source and drain regions 125 extend in the depth direction below the interface between the gate insulation layer 117 and the channel region 113 with a distance 126. The distance 126 is adjusted in conformity with design requirements so as to form, for example, extremely shallow PN junctions as required in highly sophisticated field effect transistors having a gate length 115 of 0.1 $\mu$m and less.

The drain and source regions 125 are formed by a correspondingly designed anneal cycle, wherein process parameters such as temperature and duration are selected to activate the dopants of the second species within the regions 125 and to obtain a required diffusion of the dopants to achieve the specified distance 126 and also to form the extension regions 127. In one embodiment, the temperature may be selected within a range of approximately 900–1100° C. and the time interval may be selected within a range of approximately 5–20 seconds. Thus, contrary to the conventional approach, the extension regions 127 may be formed by a single anneal cycle without requiring a separate implantation step and corresponding photolithography mask techniques. Moreover, the process parameters for the anneal cycle may be selected so as to obtain a minimal overlap of the extension regions 127 with the gate electrode 120, to thereby significantly reduce the parasitic Miller capacitance formed between a gate electrode and the drain and source regions 125. The lateral dimension of the extension regions 127 may be controlled by varying the width 116 of the spacer elements 114 in combination with selecting the lateral dimension of the gate opening 111 (see FIG. 1b). If, for example, extremely shallow PN junctions, i.e., a small distance 126, is desired, requiring a shorter anneal time, the dimensions of the gate opening 111 may be selected to be sufficiently small, thereby allowing the width 116 of the spacers 114 to be reduced, while maintaining a desired gate length 115. Consequently, the same process parameters of the anneal cycle for forming the drain/source regions 125 and thus the extension regions 127 ensuring the small distance 126 may nevertheless provide the extension regions 127 with a lateral dimension extending close to the gate insulation layer 117, as shown. If, however, a different lateral extension of the extension region 127 is required, i.e., if more or less overlap with the gate electrode 120 is required, while the same distance 126 should be maintained, the spacer deposition and formation of the gate opening 111 may correspondingly be adapted to these requirements.

Figure 1I:
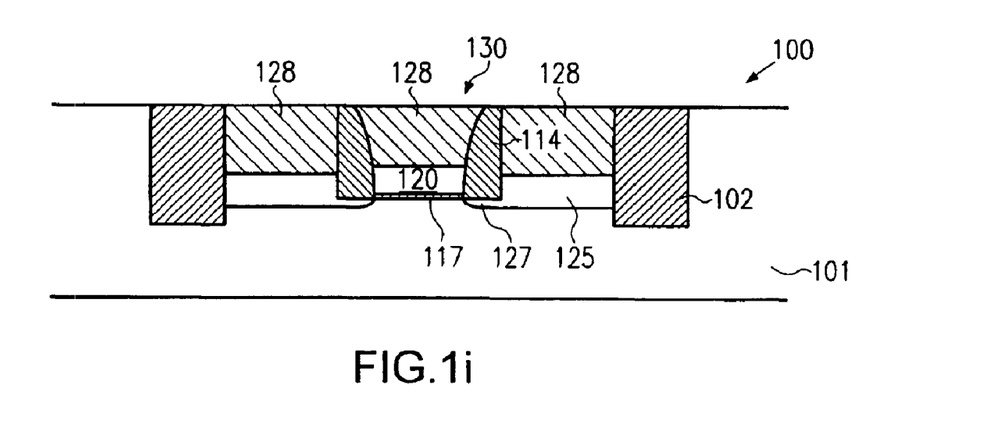

FIG. 1*i* schematically shows the semiconductor structure 100 with a completed transistor structure including a gate electrode structure 130 and the drain and source regions 125 including highly conductive silicide regions 128. The gate electrode structure 130 includes the doped gate electrode material 120 above which a highly conductive silicide region 128 is also formed. The silicide regions 128 may be comprised of any appropriate silicide of a refractory metal, such as cobalt silicide, nickel silicide, and the like. Contrary to conventional devices having raised source and drain regions formed by epitaxial growth, the formation of silicide spikes in the regions 125 is significantly reduced or even completely avoided due to the high crystalline quality of the source and drain regions 125 and due to the absence of facets and voids that may be created in the conventional epitaxial growth. Moreover, the vertical extension of the silicide regions 128 may be tailored to obtain a large amount of silicide within the gate electrode 120 so as to increase the electrical conductivity thereof, since the extremely recessed gate structure 130, according to the present invention, obviates the necessity for forming the silicide regions 128 in accordance with the dimensions of the drain and source regions 125. Therefore, the silicide region 128 in the gate electrode 120 may even represent 90% or more of the conductive material in the gate electrode. In one embodiment, the gate electrode 120 may comprise a silicide region 128 that substantially extends down to the gate insulation layer 117.

The silicide regions 128 may be formed in accordance with standard CMOS processing and thus may include the deposition of a refractory metal layer with the required thickness and a subsequent anneal cycle for converting the silicon in the drain and source regions 125 and the gate electrode 120 into silicide. Depending on the type of refractory metal, one or more anneal cycles may be required to obtain a low resistance phase of the corresponding silicide. Thereafter, the non-reacted refractory metal is removed by a selective wet etch process, or may be removed by chemical mechanical polishing due to the substantially even surface of the semiconductor structure 100.

Thereafter, metal contacts (not shown) may be formed by depositing an insulating layer (not shown), which is then patterned to receive respective openings that are filled with an appropriate contact metal. During the formation of the metal contacts, no CMP steps are necessary, as opposed to a conventional process flow, thereby reducing process complexity.

As a result, the present invention allows the formation of field effect transistors having a recessed gate structure with extremely shallow yet highly conductive PN junctions, since the source and drain regions extend along the entire height of the gate electrode structure. Therefore, the drain and source region surfaces are substantially even with the top of the gate electrode structure, thereby significantly simplifying further processing, for example, in forming silicide regions in the drain/source and gate regions. Due to the substantially equal height of the drain and source regions and of the gate electrode structure, the formation of the silicide portions is no longer limited by the penetration depth of the silicide into the source and drain regions, but may be tailored to obtain a minimum sheet resistance in the gate electrode structure. Additionally, contrary to the conventional processing of raised source and drain transistors, no selective epitaxial growth steps are required, thereby significantly minimizing tool costs and increasing production yield. The formation of the extension regions in the drain and source areas is accomplished by a rapid thermal anneal cycle, wherein process parameters may correspondingly be controlled to adjust an overlap between the source and drain regions and the gate electrode structure so as to obtain enhanced performance in that, for example, a very low Miller capacitance is generated. The effective gate length of the gate electrode structure may be adjusted by controlling the width of the spacer elements by well-controlled and well-established deposition and anisotropic etch procedures. Consequently, no further complex trim steps for adjusting the gate length are required, as is the case in conventional devices. Furthermore, process steps, such as an implantation sequence for forming extension regions and any masking steps associated therewith, may be avoided, thereby improving process efficiency and process quality.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method of forming a recessed gate transistor, the method comprising:
   forming a resist mask over a substrate, said resist mask exposing an active region formed in said substrate;
   implanting a first dopant species of a first conductivity type into said active region to a first depth;
   implanting a second dopant species of an inverse conductivity type relative to said first conductivity type into said active region to a second depth that is less than said first depth; and
   forming a gate opening in said active region, wherein a depth of said gate opening substantially corresponds to said second depth.

2. The method of claim 1, further comprising forming dielectric spacer elements on sidewalls of said gate opening.

3. The method of claim 2, wherein a width of said spacer elements at the bottom of said gate opening is controlled to adjust a gate length of said recessed gate transistor.

4. The method of claim 2, wherein forming said dielectric spacer elements includes depositing a dielectric layer and anisotropically etching said dielectric layer, wherein at least one process parameter in depositing said dielectric layer and anisotropically etching said dielectric layer is controlled to adjust a gate length of said recessed gate transistor.

5. The method of claim 4, wherein a width of said gate opening is controlled in conformity with said at least one process parameter to adjust said gate length.

6. The method of claim 5, wherein at least one of a duration and a temperature in annealing said substrate is controlled to obtain a specified junction depth of said source/drain extension regions.

7. The method of claim 6, wherein a width of said spacer elements and of said gate opening are controlled in conformity with said specified junction depth to obtain a required overlap with said gate electrode.

8. The method of claim 1, further comprising forming a gate insulation layer at the bottom of said gate opening and filling said gate opening with a gate electrode material.

9. The method of claim 8, further comprising removing excess material of said gate electrode material by chemical mechanical polishing.

10. The method of claim 9, wherein said chemical mechanical polishing is performed such that an upper portion of said spacer elements is removed.

11. The method of claim 9, further comprising forming a second resist mask exposing said gate electrode material in said gate opening and implanting a third dopant species into said gate electrode material.

12. The method of claim 1, further comprising annealing said substrate to laterally diffuse said second dopant species and form source/drain extension regions.

13. A method of forming a recessed gate transistor, the method comprising:
    forming a gate opening in an active region formed in a substrate and having a first dopant species of a first conductivity type provided up to a first depth, and a second dopant species of an inverse conductivity type relative to said first conductivity type provided up to a second depth that is less than said first depth, wherein a depth of said gate opening extends substantially to said second depth;
    forming a gate electrode structure in said gate opening; and
    annealing said substrate to form source/drain regions and extension regions by diffusing said second dopant species.

14. The method of claim 13, wherein forming said gate electrode structure comprises forming dielectric spacer elements on sidewalls of said gate opening.

15. The method of claim 14, wherein a distance of said spacer elements at the bottom of said gate opening is controlled to adjust a gate length of said recessed gate transistor.

16. The method of claim 14, wherein forming said dielectric spacer elements includes depositing a dielectric layer and anisotropically etching said dielectric layer, wherein at least one process parameter in depositing said dielectric layer and anisotropically etching said dielectric layer is controlled to adjust a gate length of said recessed gate transistor.

17. The method of claim 16, wherein a width of said gate opening is controlled in conformity with said at least one process parameter to adjust said gate length.

18. The method of claim 17, wherein at least one of a duration and a temperature in annealing said substrate is controlled to obtain a specified junction depth of said source/drain extension regions.

19. The method of claim 18, wherein a width of said spacer elements and of said gate opening are controlled in conformity with said specified junction depth to adjust an overlap of said extension regions with said gate electrode.

20. The method of claim 13, wherein forming said gate electrode structure comprises forming a gate insulation layer at the bottom of said gate opening and filling said gate opening with a gate electrode material.

21. The method of claim 20, further comprising removing excess material of said gate electrode material by chemical mechanical polishing.

22. The method of claim 21, wherein said chemical mechanical polishing is performed such that an upper portion of said spacer elements is removed.

23. The method of claim 21, further comprising forming a second resist mask exposing said gate electrode material and implanting a third dopant species into said gate electrode material.

24. A method of forming shallow source/drain extension regions in a recessed gate transistor, the method comprising:
    implanting a first dopant species of a first conductivity type with a first implantation energy into an active region formed in a substrate;
    implanting a second dopant species of an inverse conductive type relative to said first conductivity type with a second implantation energy into said active region;
    forming a recessed gate electrode structure in said active region; and
    forming source/drain extension regions adjacent to said gate electrode structure by annealing said substrate.

25. The method of claim 24, further comprising forming a resist mask over said substrate to expose said active region prior to implanting said first and second dopant species.

26. The method of claim 25, wherein a thickness of said resist mask is sufficient to substantially stop said first and second dopant species.

27. The method of claim 24, wherein forming said gate electrode structure comprises forming a gate opening in said active region and forming dielectric spacer elements on sidewalls of said gate opening.

28. The method of claim 27, wherein a width of said spacer elements at the bottom of said gate opening is controlled to adjust a gate length of said recessed gate transistor.

29. The method of claim 27, further comprising forming a gate insulation layer at the bottom of said gate opening and filling said gate opening with a gate electrode material.

30. The method of claim 29, further comprising removing excess material of said gate electrode material by chemical mechanical polishing.

31. The method of claim 30, wherein said chemical mechanical polishing is performed such that an upper portion of said spacer elements is removed.

32. The method of claim 31, further comprising forming a second resist mask exposing said gate electrode material in said gate opening and implanting a third dopant species into said gate electrode material.

33. The method of claim 27, wherein forming said dielectric spacer elements includes depositing a dielectric layer and anisotropically etching said dielectric layer, wherein at least one process parameter in depositing said dielectric layer and anisotropically etching said dielectric layer is controlled to adjust a gate length of said recessed gate transistor.

34. The method of claim 33, wherein a width of said gate opening is controlled in conformity with said at least one process parameter to adjust said gate length.

35. The method of claim 24, wherein said substrate is annealed at a temperature in the range of approximately 900–1100° C. for a time interval of approximately 10–20 seconds.

36. The method of claim 24, wherein at least one of a duration and a temperature in annealing said substrate is controlled to obtain a specified junction depth of said source/drain extension regions.

37. The method of claim 36, wherein a width of said spacer elements and of said gate opening are controlled in conformity with said specified junction depth to obtain a required overlap with said gate electrode.

38. A method of forming shallow source/drain extension regions in a recessed gate transistor, the method comprising:
   implanting a first dopant species with a first implantation energy into an active region formed in a substrate;
   implanting a second dopant species with a second implantation energy into said active region;
   forming a recessed gate electrode structure in said active region comprising the acts of;
      forming a gate opening in said active region;
      forming dielectric spacer elements on sidewalls of said gate opening;
      forming a gate insulation layer at the bottom of said gate opening;
      filling said gate opening with a gate electrode material;
      removing excess material of said gate electrode material by chemical mechanical polishing; and
   forming source/drain extension regions adjacent to said gate electrode structure by annealing said substrate.

39. The method of claim 38, wherein said chemical mechanical polishing is performed such that an upper portion of said spacer elements is removed.

40. The method of claim 38, wherein a width of said spacer elements at the bottom of said gate opening is controlled to adjust a gate length of said recessed gate transistor.

41. The method of claim 38, wherein said substrate is annealed at a temperature in the range of approximately 900–1100° C. for a time interval of approximately 10–20 seconds.

42. The method of claim 38, wherein at least one of a duration and a temperature in annealing said substrate is controlled to obtain a specified junction depth of said source/drain extension regions.

43. The method of claim 38, wherein said first and second dopant species are of opposite conductivity types.

44. The method of claim 38, wherein said first dopant species is an N-type dopant material and said second dopant species is a P-type dopant material.

45. The method of claim 38, wherein said first dopant species is a P-type dopant material and said second dopant species is an N-type dopant material.

46. A method of forming a recessed gate transistor, the method comprising:
   forming a resist mask over a substrate, said resist mask exposing an active region formed in said substrate;
   implanting a first dopant species into said active region to a first depth;
   implanting a second dopant species into said active region to a second depth that is less than said first depth;
   forming a gate opening in said active region, said gate opening defining a bottom surface, wherein a depth of said bottom surface of said gate opening substantially corresponds to said second depth; and
   forming a gate insulation layer on said bottom surface.

47. The method of claim 46, further comprising, prior to forming said gate insulation layer, forming dielectric spacer elements on sidewalls of said gate opening.

48. The method of claim 47, wherein a width of said spacer elements at the bottom surface of said gate opening is controlled to adjust a gate length of said recessed gate transistor.

49. The method of claim 46, further comprising filling said gate opening with a gate electrode material.

50. The method of claim 49, further comprising removing excess material of said gate electrode material by chemical mechanical polishing.

51. The method of claim 50, wherein said chemical mechanical polishing is performed such that an upper portion of said spacer elements is removed.

52. The method of claim 46, further comprising annealing said substrate to laterally diffuse said second dopant species and form source/drain extension regions.

53. The method of claim 52, wherein at least one of a duration and a temperature in annealing said substrate is controlled to obtain a specified junction depth of said source/drain extension regions.

54. The method of claim 46, wherein said first and second dopant species are of opposite conductivity types.

55. The method of claim 46, wherein said first dopant species is an N-type dopant material and said second dopant species is a P-type dopant material.

56. The method of claim 46, wherein said first dopant species is a P-type dopant material and said second dopant species is an N-type dopant material.

57. A method of forming a recessed gate transistor, the method comprising:
   forming a gate opening defining a bottom surface in an active region formed in a substrate and having a first dopant species provided up to a first depth, and a second dopant species provided up to a second depth that is less than said first depth, wherein a depth of said bottom surface of said gate opening extends substantially to said second depth;
   forming a gate insulation layer on said bottom surface;
   forming a gate electrode in said gate opening above said gate insulation layer; and
   annealing said substrate to form source/drain regions and extension regions by diffusing said second dopant species.

58. The method of claim 57, further comprising, prior to forming said gate insulation layer, forming dielectric spacer elements on sidewalls of said gate opening.

59. The method of claim 58, wherein a distance of said spacer elements at the bottom surface of said gate opening is controlled to adjust a gate length of said recessed gate transistor.

60. The method of claim 57, wherein forming said gate electrode filling said gate opening with a gate electrode material.

61. The method of claim 60, further comprising removing excess material of said gate electrode material by chemical mechanical polishing.

62. The method of claim 60, wherein said chemical mechanical polishing is performed such that an upper portion of said spacer elements is removed.

63. The method of claim 57, wherein at least one of a duration and a temperature in annealing said substrate is controlled to obtain a specified junction depth of said source/drain extension regions.

64. The method of claim 57, wherein said first and second dopant species are of opposite conductivity types.

65. The method of claim 57, wherein said first dopant species is an N-type dopant material and said second dopant species is a P-type dopant material.

66. The method of claim 57, wherein said first dopant species is a P-type dopant material and said second dopant species is an N-type dopant material.

* * * * *